United States Patent
Proesbsting

(10) Patent No.: US 8,151,044 B2
(45) Date of Patent: *Apr. 3, 2012

(54) CONCURRENT MEMORY BANK ACCESS AND REFRESH RETIREMENT

(75) Inventor: Robert Proesbsting, Sonora, CA (US)

(73) Assignee: Intellectual Ventures I LLC, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 12/635,543

(22) Filed: Dec. 10, 2009

(65) Prior Publication Data

US 2010/0095058 A1   Apr. 15, 2010

Related U.S. Application Data

(63) Continuation of application No. 11/085,770, filed on Mar. 21, 2005, now Pat. No. 7,640,391, which is a continuation of application No. 09/999,563, filed on Nov. 15, 2001, now Pat. No. 6,871,261, which is a continuation-in-part of application No. 09/503,048, filed on Feb. 12, 2000, now Pat. No. 6,356,485.

(60) Provisional application No. 60/120,032, filed on Feb. 13, 1999.

(51) Int. Cl.
  *G06F 12/00*   (2006.01)
(52) U.S. Cl. .................................. 711/107; 711/106
(58) Field of Classification Search ........................ None
  See application file for complete search history.

(56) References Cited

U.S. PATENT DOCUMENTS

| | | |
|---|---|---|
| 4,431,971 A | 2/1984 | Haque |
| 4,693,925 A | 9/1987 | Cheung et al. |
| 5,126,975 A | 6/1992 | Handy et al. |
| 5,212,456 A | 5/1993 | Kovalcik et al. |
| 5,265,231 A | 11/1993 | Nuwayser |
| 5,289,137 A | 2/1994 | Nodar et al. |

(Continued)

FOREIGN PATENT DOCUMENTS

JP   11-306783   10/1999

OTHER PUBLICATIONS

Office Action, mailed Dec. 28, 1999, for U.S. Appl. No. 09/285,232, 5 pages.

(Continued)

*Primary Examiner* — Than Nguyen
(74) *Attorney, Agent, or Firm* — Schwabe, Williamson & Wyatt, P.C.

(57) ABSTRACT

A dynamic random access memory integrated circuit and method includes internal refresh control and an array configured to receive read and write access requests having priority over pending refresh requests, wherein refresh requests are queueable and retired on clock cycles not requiring an access of the array and complete in one clock cycle. No on-board cache memory is required. A method includes: determining within the circuit when one of the banks of the array requires a refresh, prioritizing read and write access requests over pending refresh requests, read access requests initiating an access to the array without determining whether data is available from outside the array, and retiring within a clock cycle one pending refresh request to a bank when that bank has pending refresh requests and does not also require an access of the array on that clock cycle.

10 Claims, 2 Drawing Sheets

U.S. PATENT DOCUMENTS

| | | | |
|---|---|---|---|
| 5,295,094 A | | 3/1994 | Miyatake |
| 5,315,130 A | * | 5/1994 | Hively et al. ............ 257/48 |
| 5,388,222 A | | 2/1995 | Chisvin et al. |
| 5,392,249 A | | 2/1995 | Kan |
| 5,420,816 A | | 5/1995 | Ogihara et al. |
| 5,422,600 A | | 6/1995 | Petty et al. |
| 5,475,643 A | | 12/1995 | Ohta |
| 5,477,191 A | | 12/1995 | Demicheli |
| 5,510,749 A | | 4/1996 | Arimoto |
| 5,547,405 A | | 8/1996 | Pinney et al. |
| 5,581,126 A | | 12/1996 | Moench |
| 5,586,076 A | | 12/1996 | Miyamoto et al. |
| 5,592,421 A | | 1/1997 | Kaneko et al. |
| 5,623,628 A | | 4/1997 | Brayton et al. |
| 5,633,832 A | | 5/1997 | Patel et al. |
| 5,648,927 A | | 7/1997 | Tran |
| 5,654,933 A | | 8/1997 | McLaury |
| 5,659,260 A | | 8/1997 | Kajimoto et al. |
| 5,673,225 A | | 9/1997 | Jeong et al. |
| 5,679,027 A | | 10/1997 | Smith |
| 5,691,949 A | * | 11/1997 | Hively et al. ............ 365/230.03 |
| 5,696,727 A | | 12/1997 | Tsukude et al. |
| 5,703,828 A | | 12/1997 | Park et al. |
| 5,719,531 A | | 2/1998 | Kotani et al. |
| 5,726,944 A | | 3/1998 | Pelley, III et al. |
| 5,737,764 A | | 4/1998 | Shigeeda |
| 5,768,186 A | | 6/1998 | Ma |
| 5,781,481 A | | 7/1998 | Iwakiri |
| 5,784,705 A | | 7/1998 | Leung |
| 5,819,264 A | | 10/1998 | Palmon |
| 5,835,440 A | | 11/1998 | Manning |
| 5,841,688 A | | 11/1998 | Sukegawa et al. |
| 5,862,093 A | | 1/1999 | Sakakibara |
| 5,873,114 A | | 2/1999 | Rahman et al. |
| 5,886,919 A | | 3/1999 | Morikawa et al. |
| 5,892,400 A | | 4/1999 | van Saders et al. |
| 5,893,158 A | | 4/1999 | Furuta |
| 5,901,097 A | | 5/1999 | Koshikawa |
| 5,903,502 A | | 5/1999 | Porter |
| 5,936,905 A | | 8/1999 | Proebsting |
| 5,940,315 A | | 8/1999 | Cowles |
| 5,940,329 A | | 8/1999 | Seitsinger et al. |
| 5,940,342 A | | 8/1999 | Yamazaki et al. |
| 5,946,253 A | | 8/1999 | Fujiwara |
| 5,949,732 A | | 9/1999 | Kirihata |
| 5,991,223 A | | 11/1999 | Kozaru et al. |
| 5,999,474 A | * | 12/1999 | Leung et al. .............. 365/222 |
| 6,009,019 A | | 12/1999 | Fang |
| 6,060,871 A | | 5/2000 | Barker |
| 6,061,296 A | | 5/2000 | Ternullo, Jr. et al. |
| 6,075,736 A | | 6/2000 | Kim et al. |
| 6,075,746 A | | 6/2000 | Ohsawa |
| 6,088,270 A | | 7/2000 | Hardee |
| 6,115,307 A | | 9/2000 | Casper |
| 6,141,262 A | | 10/2000 | Sudo |
| 6,191,978 B1 | | 2/2001 | Watanabe et al. |
| 6,212,109 B1 | | 4/2001 | Proebsting |
| 6,240,046 B1 | | 5/2001 | Proebsting |
| 6,298,413 B1 | | 10/2001 | Christenson |
| 6,310,814 B1 | * | 10/2001 | Hampel et al. .............. 365/222 |
| 6,356,485 B1 | | 3/2002 | Proebsting |
| 6,373,753 B1 | * | 4/2002 | Proebsting ............ 365/189.09 |
| 6,415,353 B1 | | 7/2002 | Leung |
| 6,487,648 B1 | * | 11/2002 | Hassoun ................ 711/167 |
| 6,871,261 B1 | * | 3/2005 | Proebsting ............... 711/106 |
| 2002/0056022 A1 | * | 5/2002 | Leung ..................... 711/106 |
| 2005/0166009 A1 | | 7/2005 | Proebsting |

OTHER PUBLICATIONS

Office Action, mailed Feb. 7, 2000, for U.S. Appl. No. 09/329,975, 7 pages.
Office Action, mailed Aug. 15, 2000, for U.S. Appl. No. 09/372,320, 6 pages.
Notice of Allowability, mailed Mar. 30, 2000, for U.S. Appl. No. 09/451,042, 3 pages.
Office Action, mailed Sep. 13, 2001, for U.S. Appl. No. 09/474,351, 9 pages.
Notice of Allowability, mailed May 7, 2002, for U.S. Appl. No. 9/474,351, 4 pages.
Notice of Allowability, mailed Mar. 6, 2001, for U.S. Appl. No. 09/499,265, 3 pages.
Office Action, mailed Aug. 25, 2000, for U.S. Appl. No. 09/499,265, 7 pages.
Notice of Allowability, mailed Oct. 24, 2000, for U.S. Appl. No. 09/502,983, 3 pages.
Notice of Allowability, mailed Oct. 22, 2001, for U.S. Appl. No. 09/503,048, 4 pages.
Office Action, mailed Mar. 2, 2001, for U.S. Appl. No. 09/503,050, 6 pages.
Office Action, mailed Nov. 7, 2000, for U.S. Appl. No. 09/503,050, 8 pages.
Notice of Allowability, mailed May 3, 2005, for U.S. Appl. No. 09/503,108, 3 pages.
Final Office Action, mailed Apr. 18, 2001, for U.S. Appl. No. 09/503,108, 9 pages.
Office Action, mailed Nov. 27, 2001, for U.S. Appl. No. 09/503,108, 6 pages.
Office Action, mailed Dec. 1, 2000, for U.S. Appl. No. 09/503,108, 11 pages.
Notice of Allowability, mailed Aug. 29, 2000, for U.S. Appl. No. 09/503,109, 3 pages.
Notice of Allowability, mailed Apr. 25, 2002, for U.S. Appl. No. 09/999,563, 3 pages.
Office Action, mailed Jul. 29, 2008, for U.S. Appl. No. 11/085,770, 9 pages.
Final Office Action, mailed Feb. 4, 2008, for U.S. Appl. No. 11/085,770, 5 pages.
Office Action, mailed May 16, 2007, for U.S. Appl. No. 11/085,770, 5 pages.
Nitta, Y., et al., "A 1.6GB/s Data-Rate 1Gb Synchronous DRAM with Hierarchical Square-Shaped Memory Block and Distributed Bank Architecture," 1996 Digest of Technical Papers, vol. 39, 1996 IEEE International Solid-State Circuits Conference, Feb. 8, 1996, pp. 376-377 and 477.
Aimoto, Y., et al. "A 7.68GIPS 3.84GB/s 1 W Parallel Image-processing RAM Integrating a 16Mb DRAM and 128 Processors", 1996 Digest of Technical Papers, vol. 39, 1996 IEEE International Solid-State Circuits Conference, Feb. 8, 1996, pp. 372-373 and 476.
Ayukawa, K., et al., "An Access-Sequence Control Scheme to Enhance Random-0Access Performance of Embedded DRAM's, " IEEE Journal of Solid-State Circuits, vol. 33, No. 5, May 1998, pp. 800-806.
Duisters, T., and Dijkmans, E., "A -90-dB THD Rail-to Rail Input Opamp Using a New Local Charge Pump in CMOS," IEEE Journal of Solid-State Circuits, vol. 33, No. 7, Jul. 1998, pp. 947-955.
Eto et al., A 1Gb SDRAM with Ground Level Precharged Bitlikne and Non-Boosted 2.1V Word Line,: 1998 Digest of Technical Papers, vol. 41, 1998 IEEE International Solid-State Circuits Conference, Feb. 5, 1998, pp. 82-83 and 419.
Eto et al., "A 1-Gb SDRAM with Ground-Level Precharged Bit Line and Nonboosted 2.1-V Word Line,9" IEEE Journal of Solid-State Circuits, vol. 33, No. 11, Nov. 1998, pp. 1697-1702.
Gillingham, P., et al., "High-Speed, High-Reliability Circuit Design for Megabit DRAM," IEEE Journal of Solid-State Circuits, vol. 26, No. 8, Aug. 1991, pp. 1171-1175.
Griffin, M., et al., "A Process-Independent, 800-MB/s, DRAM Byte-Wide Interface Featuring Command Interleaving and Concurrent Memory Operation," IEEE Journal of Solid-State Circuits, vol. 33, No. 11, Nov. 1998, pp. 1741-1751.
Hamamoto, T., et al., "400-MHz Random Column Operating SDRAM Techniques with Self-Skew Compensation," IEEE Journal of Solid-State Circuits, vol. 33, No. 5, May 1998, pp. 770-778.
Hatakeyama et al., A 256MB SDRAM Using a Register-Controlled Digital DLL, 1997 Digest of Technical Papers, vol. 40, 1997 IEEE International Solid-State Circuits Conference, Feb. 6, 1997, pp. 71-73 and 433.
Itoh, K., et al., "Limitations and Challenges of Mulitgigabit DRAM Chip Design," IEEE Journal of Solid-State Circuit, vol. 32, No. 5, May 1997, pp. 624-634.

Kirihata et al., "Flexible Test Mode Approach for 256-Mb DRAM," IEEE Journal of Solid-State Circuits, vol. 32, No. 10, Oct. 1997, pp. 1525-1534.

Kirihata, T., et al., "A 220mm.sup.2 4 and 8 Bank 256Mb SDRAM with Single-Sided Stitched WL Architecture," 1998 Digest of Technical Papers, vol. 41, 1998 IEEE International Solid-State Circuits Conference, Feb. 5, 1998, pp. 78-79 and 417.

Kuge, S., et al., "SOI-DRAM Circuit Technologies for Low Power High Speed Multigiga Scale Memories," IEEE Journal of Solid State Circuits, vol. 31, No. 4, Apr. 1996, pp. 586-591.

Kushiyama, N., et al., "An Experimental 295 MHz CMOS 4K×256 SRAM Using Bidirectional Read/Write Shared Sense Amps and Self-Timed Pulsed Word-Line Drivers," IEEE Journal of Solid-State Circuits, vol. 30, No. 11, Nov. 1995, pp. 1286-1290.

Lee, K., et al., "Low-Voltage, High-Speed Circuit Designs for Gigabit DRAM's,"IEEE Journal of Solid-State Circuits, vol. 32, No. 5, May 1997, pp. 642-648.

Lu et al., "A 22-ns 1-Mbit CMOS High-Speed DRAM with Address Multiplexing," IEEE Journal of Solid-State Circuits, vol. 24, No. 5, Oct. 1989, pp. 1198-1205.

Mai et al., "Low-Power SRAM Design Using Half-Swing Pulse-Mode Techniques," IEEE Journal of Solid-State Circuits, vol. 33, No. 11, Nov. 1998, pp. 1659-1671.

Miyuno, S., et al., "A 1.6 Gbyte/s Data Transfer Rate 8 Mb Embedded DRAM," IEEE Journal of Solid-State Circuits, vol. 30, No. 11, Nov. 1995, pp. 1281-1285.

Miyawaki, Y., et at., "A New Erasing and Row Decoding Scheme for Low Supply Voltage Operation 16-Mb/64-Mb Flash Memories," IEEE Journal of Solid-State Circuits, vol. 27, No. 4, Apr. 1992, pp. 583-588.

Montanaro et al., "A 160-MHz, 32-b, 0.5-W CMOS RISC Mircorprocessor," IEEE Journal of Solid-State Circuits, vol. 31, No. 11, Nov. 1996, pp. 1703-1714.

Morimura, H., and Shibata, N., "A Step-Down Boosted-Wordline Schemem for 1-V Battery-Operated Fast SRAM;s," IEEE Journal of Solid-State Circuits, vol. 27, No. 4, Apr. 1992, pp. 583-588.

Murotani, T., et al., "A 4-Level Storage 4Gb DRAM," 1997 Digest of Technical Papers, vol. 40, 1997 IEEE International Solid-State Circuits Conference, Feb. 6, 1997, pp. 74-75 and 433.

Nakamura, K., et al., "A 500MHz 4-Mb CMOS Pipeline-Burst Cache SRAM with Point-to-Point Noise Reduction Coding I/O," IEEE Journal of Solid-State Circuits, vol. 32, No. 11, Nov. 1997, pp. 1758-1765.

Nakamura, K., et al., "A 500MHz 4-Mb CMOS Pipeline-Burst Cache SRAM with Point-to-Point Noise Reduction Coding I/O,"1997 Digest of Technical Papers, vol. 40, 1997 IEEE International Solid-State Circuits Conference, Feb. 6, 1997, pp. 406-407 and 495, 8 pages.

Nakamura, M., et al., "A 29-ns 64-Mb DRAM with Hierarchical Array Architecture," IEEE Journal of Solid-State Circuits, vol. 31, No. 9, Sep. 1996, pp. 1302-1307.

Nambu et al., "A 1.8ns Access, 550MHz 4.5Mb CMOS SRAM," 1998 Digest of Technical Papers, vol. 41, 1998 IEEE International Solid-State Circuits Conference, Feb. 5, 1998, pp. 360-361 and 464.

Nambu et al., "A 1.8-ns Access, 550-MHz, 4.5-Mb CMOS SRAM," IEEE Journal of Solid-State Circuits, vol. 33, No. 11, Nov. 1998, pp. 1650-1658.

Osada, K., et al., "A 2ns Access, 285MHz, Two-Port Cache Macro using Double Global Bit-Line Pairs," 1997 Digest of Technical Papers, vol. 40, 1997 IEEE International Solid-State Circuits Conference, Feb. 6, 1997, pp. 402-403 and 494.

Reed et al., "A 250MHz 5W RISC Microprocessor with On-Chip L2 Cache Controller," 1997 Digest of Technical Papers, vol. 40, 1997 IEEE International Solid-State Circuits Conference, Feb. 6, 1997, pp. 412-413 and 496.

Saeki, T., et al., "A 2.5ns Clock Access 250MHz 256Mb SDRAM with a Synchronous Mirror Delay," 1996 Digest of Technical Papers, vol. 39, 1996 IEEE International Solid-State Circuits Conference, Feb. 8, 1996, pp. 374-375 and 476.

Saeki, T., et al., "A 2.5-ns Clock Access, 250-MHz, 256-Mb SDRAM with Synchronous Mirror Delay," IEEE Journal of Solid-State Circuits, vol. 31, No. 11, Nov. 1996, pp. 1656-1668.

Saito, M. "500Mb/s non-Prechaged Data Bus for High-Speed DRAM," 1998 Digest of Technical Papers, vol. 41, 1998 IEEE International Solid-State Circuits Conference, Feb. 5, 1998, pp. 76-77 and 416.

Saito, M., et al. "500-Mb/s Nonprecharged Data Bus for High-Speed DRAM's," IEEE Journal of Solid-State Circuits, vol. 33, No. 11, Nov. 1998, pp. 1720-1730.

Sakashita, N., et al., "A 1.6-GB/s Data-Rate 1-Gb Synchronous DRAM with Hierarchical Square-Shaped Memory Block and Distributed Bank Architecture," IEEE Journal of Solid-State Circuits, vol. 31, No. 11, Nov. 1996, pp. 1645-1655.

Sakata, T., et al., "An Experimental 220-MHz 1-Gb DRAM with a Distributed-Column-Control Architecture," IEEE Journal of Solid State Circuits, vol. 30, No. 11, Nov. 1995, pp. 1165-1173.

Sugibayashi t. et al., "A 1-Gb DRAM for File Applications," IEEE Journal of Solid-State Circuits, vol. 30, No. 11, Nov. 1995, pp. 1277-1280.

Suh, J.-W., et al., "Offset-Trimming Bit-Line Sensing Scheme for Gigabit-Scale DRAM's," IEEE Journal of Solid-State Circuits, vol. 31, No. 7, Jul. 1996, pp. 1025-1028.

Sunaga, T., "A Full Bit Prefetch Architecture for Synchronous DRAM's" IEEE Journal of Solid-State Circuits, vol. 30, No. 9, Sep. 1995, pp. 998-1005.

Sunaga, T., "A Full Bit Prefetch DRAM Sensing Circuit," IEEE Journal of Solid-State Circuits, vol. 31, No. 6, Jun. 1996, pp. 767-772.

Sunaga, T., et al., "An Eight-Bit Prefetch Circuit for High-Bandwidth DRAM's," IEEE Journal of Solid-State Circuits, vol. 32, No. 1, Jan. 1997, pp. 105-110.

Sunaga, T., et al., "DRAM Macros for ASIC Chips," IEEE Journal of Solid-State Circuits, vol. 30, No. 9, Sep. 1995, pp. 1006-1014.

Torrance, R., et al., "A 33GB/s 13.4Mb Integrated Graphics Accelerator and Frame Buffer," 1998 Digest of Technical Papers, vol. 41, 1998 IEEE International Solid-State Circuits Conference, Feb. 5, 1998, pp. 340-341 and 461.

Tsukude, M., et al., "A 1.2-to 3.3-V Wide Voltage-Range/Low-Power DRAM with a Charge-Transfer Presensing Scheme," IEEE Journal of Solid-State Circuits, vol. 32, No. 11, Nov. 1997, pp. 1721-1727.

Ukita, M., et al. "A Single-Bit-Line Cross-Point Cell Activation (SCPA) Architecture for Ultra-Low-Power SRAM's," IEEE Journal of Solid-State Circuits, vol. 28, No. 11, Nov. 1993, pp. 1114-1118.

Watanabe, Y., et al., "A 286 mm.sup.2 256 Mb DRAM with x32 Both-Ends DQ," IEEE Journal of Solid-State Circuits, vol. 31, No. 4, Apr. 1996, pp. 567-574.

Yabe, T., et al., "A Configurable DRAM Macro Design for 2112 Derivative Organizations to be Synthesized Using a Memory Generator," 1998 Digest of Technical Papers, vol. 41, 1998 IEEE International Solid-State Circuits Conference, Feb. 5, 1998, pp. 72-73 and 415.

Yabe, T. et al., "A Configurable DRAM Marco Design for 2112 Derivative Organizations to be Synthesized Using a Memory Generator," IEEE Journal of Solid-State Circuits, vol. 33, No. 11, Nov. 1998, pp. 1752-1757.

Yamagata, T., et al., "Low Voltage Circuit Design Techniquesfor Battery-Operated and/or Giga-Scale DRAM's," IEEE Journal of Solid-State Circuits, vol. 30, No. 11, Nov. 1995, pp. 1183-1188.

Yoo, J.-H., et al., "A 32-Bank 1 Gb Self-Strobing Synchronous DRAM with 1 Gbyte/s Bandwidth," IEEE Journal of Solid-State Circuits, vol. 31, No. 11, Nov. 1996, pp. 1635-1644.

Yoo, J.-H., et al., "A 32-Bank 1Gb DRAM with 1GB/s Bandwidth," 1996 Digest of Technical Papers, vol. 39, 1996 IEEE International Solid-State Circuits Conference, Feb. 8, 1996, pp. 378-379 and 477.

Yoo, S.-M., et al., "Variable Vcc Design Techniques for Battery-Operated DRAM's," IEEE Journal of Solid-State Circuits, vol. 28, No. 4, Apr. 1993, pp. 499-503.

Complaint for Patent Infringement, filed in the US District Court for the District of Delaware, filed Dec. 8, 2010, 307 pages.

* cited by examiner

CONCURRENT MEMORY BANK ACCESS AND REFRESH RETIREMENT

CROSS-REFERENCE TO RELATED APPLICATION

This application is a continuation of prior application Ser. No. 11/085,770, filed Mar. 21, 2005, entitled INTEGRATED CIRCUIT RANDOM ACCESS MEMORY CAPABLE OF AUTOMATIC INTERNAL REFRESH OF MEMORY ARRAY, which itself is a Continuation Application of U.S. Ser. No. 09/999,563, filed on Nov. 15, 2001, entitled, INTEGRATED CIRCUIT RANDOM ACCESS MEMORY CAPABLE OF AUTOMATIC INTERNAL REFRESH OF MEMORY ARRAY, issued as U.S. Pat. No. 6,871,261, which is a continuation-in-part of pending U.S. patent application "MERGING WRITE CYCLES BY COMPARING AT LEAST A PORTION OF THE RESPECTIVE WRITE CYCLE ADDRESSES," U.S. Ser. No. 09/503,048 filed Feb. 12, 2000, having Robert J. Proebsting listed as inventor, which application claims the benefit of U.S. provisional patent application "HIGH PERFORMANCE DYNAMIC RANDOM-ACCESS MEMORY ARRAY ARCHITECTURE AND ASSOCIATED SUPPORTING CIRCUITRY," U.S. Ser. No. 60/120,032, filed Feb. 13, 1999, having Robert J. Proebsting listed as inventor. The 60/120,032 application and the Ser. No. 09/503,048 application are hereby incorporated by reference in their entireties for all purposes.

BACKGROUND OF THE INVENTION

1. Field of the Invention

The present invention relates to semiconductor memories, and particularly to architecture and organization of a dynamic random-access memory array having automatic internal refreshing of the memory array.

2. Description of Related Art

Semiconductor random-access memory devices or subsystems using arrays of dynamic memory cells (e.g., 1-transistor/1-capacitor (1T/1C) cells) have consistently provided greater density and lower cost per bit than those using static memory cells (e.g., 6-transistor (6T) cells, or 4-transistor/2-resistor (4T/2R) cells). However, such dynamic random-access memory arrays have historically had lower operational frequencies and longer read access times when compared to static random-access memory arrays. Consequently, system designers have typically chosen dynamic memory arrays (e.g., commercially available dynamic random access memories, or DRAMs) when high density and low cost are required, such as for CPU main memory applications. Conversely, designers have typically chosen static memory arrays when the highest possible performance is required, such as for cache memory and high speed buffer applications. Examples of static memory array devices or sub-systems include commercially available static random access memories (SRAMs) and CPU-resident on-board cache memory sub-systems.

The reasons often cited for the lower performance of dynamic memory arrays include the destructive sensing of all memory cells common to the addressed word line (encountered in virtually all dynamic memory arrays) and the consequential need to restore data back into each sensed memory cell during the active cycle, the need to equilibrate bit lines and various other differential nodes and to precharge various circuit nodes between active cycles, and the requirement for periodic refreshing of all dynamic memory cells.

The need for ever-increasing memory performance at reasonable cost continues unabated. It is being driven by numerous advances toward higher frequency and higher speed applications. For example, the increasing bandwidth demands of computer networking and the internet, the increasing speeds of commercially available processors, and the proliferation of high-frequency wireless communication systems are all driving the need for higher performance memory sub-systems.

In addition to the increased speed requirements of memory systems, there is also an increasing need for low cost memory made possible by small memory cells. The smallest known read/write memory cell is the one transistor/one capacitor dynamic memory cell. Therefore, there is an unfilled need for memory devices that combine the cost advantages of the dynamic memory cell with the performance normally found in memories incorporating larger more expensive SRAM cells. In particular, a refreshing technique and method is needed that meets the goals for memory devices.

SUMMARY OF THE INVENTION

In accordance with the present invention, a random access memory integrated circuit automatically refreshes banks in a dynamic memory array without requiring an on-board cache memory, thereby using less space on the integrated circuit as compared to the space that would be required if a cache memory were to be included. The disclosed random access memory integrated circuit is responsive to an externally supplied clock input and includes a dynamic memory array configured in one or more banks, wherein the array requires periodic refreshing to maintain data. The random access memory integrated circuit further includes one or more refresh control circuits generating refresh requests inside the random access memory integrated circuit. The dynamic memory array is configured to receive read and write access requests that have priority over pending refresh requests. Any pending refresh requests are retired on a clock cycle not requiring an access of the dynamic memory array. Further, the refresh completes in one clock cycle. The read access requests initiate an access to the dynamic memory array without first determining whether data is available from outside the dynamic memory array, (i.e., from an internal cache memory) thereby avoiding a delay associated with such determination.

In one embodiment, each of the one or more banks has a one to one correspondence with one of the one or more refresh control circuits, each refresh control circuit controlling refresh of the bank coupled thereto. In embodiments containing two or more banks, during a clock cycle in which one bank of the dynamic memory array executes a read or a write operation, at least another bank of the dynamic memory array executes a read or a write operation, at least another bank may simultaneously execute a refresh operation. Also, according to an embodiment, during a clock cycle in which one bank executes a read or a write operation, two other banks may simultaneously execute refresh operations.

According to a further embodiment containing two or more banks, a separate address bus is coupled to each bank, each of the banks receiving an independent address, wherein at least one bit of the read or write access address is used to select the bank for read or write access. The bit is selected from among low order address bits on the random access memory integrated circuit. In one embodiment, the bit is selected such that the bit changes state frequently. Further, the choice of bits of the address allows the banks to share read and write accessing such that no one bank should require excessive accessing thereby denying that bank the opportunity to meet refresh requirements. Excessive accessing includes accessing the same bank more than 255 read or write cycles of each 256 clock cycles, averaged over many thousands of clock cycles.

According to one embodiment, the refresh control circuit includes at least one counter, one refresh request being generated each time the counter counts a predetermined number of external clock cycles, the refresh requests being generated independent of an elapsed time counter.

According to another embodiment, the random access memory integrated circuit outputs a refresh flag to indicate that internal refresh requirements are not being met. The flag is output after a predetermined number of refresh requests to any bank is queued.

Referring to each refresh control circuit, in one embodiment, each refresh control circuit includes a wrap around refresh request counter that increments once for each refresh request and a wrap around refresh address counter. Each wrap around refresh address counter provides the row address to be refreshed and increments in response to a refresh of the bank associated thereto. An inequality between the count in the wrap around refresh request counter and the count in the wrap around refresh address counter indicates a pending refresh requirement for that bank.

Still referring to the refresh control circuit, in another embodiment, each wrap around refresh request counter input within its respective refresh control circuit is coupled to receive a unique output from the decoder; the decoder input is coupled to receive an output from a wrap around clock cycle counter. Every predetermined number of clock cycles, the wrap around clock cycle counter in combination with the decoder cause the decoder to sequentially toggle one of a plurality of outputs. Each decoder output is configured to toggle once at a particular count of the wrap around clock cycle counter, each output to be received by a respective one of the refresh control circuits. The particular counts are the predetermined number of clock cycles apart. The predetermined number of clock cycles is more than a maximum number of queued refresh requests queued in any one refresh control circuit for any bank. The maximum number of queued refresh requests in combination with the larger predetermined number of clock cycles prevent any worst case sequence of external read or write cycles from causing more than two banks to refresh on the same clock cycle.

In one embodiment, the random access memory integrated circuit outputs a refresh flag to indicate that internal refresh requirements are not being met. The flag is output after a predetermined number of refresh requests are queued. For example, the predetermined number of queued refresh requests may be at least two. In one embodiment, the predetermined number may be almost as large as the predetermined number of clock cycles separating the toggling of individual decoder outputs.

In one embodiment, each refresh control circuit includes a wrap around refresh request counter configured to increment periodically, for example, according to a number of clock cycles. The refresh control circuit further includes a wrap around refresh address counter configured to provide an address to be refreshed. The wrap around refresh address counter increments once every time a refresh operation is carried out. Further, the refresh control circuit includes a comparator coupled to compare counts associated with addresses received from the wrap around refresh request counter and the wrap around refresh address counter. The comparator establishes a pending refresh upon detecting an inequality in the counts. The refresh control circuit further includes a circuit that, on any given cycle, determines a need or lack of need for each bank to do a memory access. If no memory access is required, and the comparator indicates one or more pending refreshes, then that bank associated with the refresh control circuit will execute one refresh cycle. Further, a row address multiplexer coupled to the bank chooses a refresh address as the row address for which the bank will execute a refresh. Thereafter, the wrap around refresh address counter increments. In one embodiment, the wrap around refresh request counter is permitted to count a plurality of counts ahead of the wrap around refresh address counter, thereby allowing queuing of a plurality of refresh requests. The wrap around refresh request counter may be one of a plurality of wrap around refresh request counters within the random access memory integrated circuit, one for each bank of memory, the plurality of wrap around refresh request counters incrementing at different times to stagger refresh operations of the plurality of banks whereby the noise generated is reduced from that which would occur if more banks refreshed simultaneously. The count of each wrap around refresh address counter provides an address to its respective bank, the address identifying a row of memory in that bank to be refreshed.

In one embodiment, each wrap around refresh request counter within each refresh control circuit receives an input from a decoder, the decoder output toggling once in response to a specific count of a wrap around clock cycle counter. The specific count of the wrap around clock cycle counter allows the wrap around refresh request counter of that bank of the dynamic memory array to increment upon reaching the specific count. Each wrap around refresh request counter within each refresh control circuit receives a respective one of a plurality of the decoder outputs and increments its count when its respective decoder output toggles. Each refresh control circuit may include a wrap around refresh address counter incrementing in response to a refresh of the bank associated thereto, an inequality between the count in the wrap around refresh request counter and the count in the wrap around refresh address counter associated with a same bank indicating a pending refresh requirement for that bank. The wrap around refresh address counter divides by a number equal to the number of refresh cycles (such as 256) required to refresh all rows in a bank.

Another embodiment of the present invention is directed to a method of refreshing a dynamic memory array contained in a dynamic memory circuit, the dynamic memory array including one or more banks subject to a plurality of read and write accesses, the banks configured to hold data without requiring data duplication outside the banks other than data requested and read from the dynamic memory array in one of the read accesses which data is not yet output from the dynamic memory circuit. The method includes determining within the circuit containing the dynamic memory circuit when one of the banks within the dynamic memory circuit requires a read or write access, and, if so, initiating an access to the dynamic memory without a delay associated with determining whether the data is available from a location outside the dynamic memory, or whether there are any pending refresh requests, the read or write access having priority over any pending refresh requests. Further, the method includes determining within the circuit containing the dynamic memory circuit when one of the banks within the dynamic memory array requires a refresh and executing that refresh if no read or write access is needed.

The method further includes retiring within one clock cycle one pending refresh request to one or more of the one or more banks having pending refresh requests if that bank(s) does not require an access on that clock cycle.

One or more address bits choose the bank to be read or written. The method includes choosing a low order address bit, (e.g., a least significant bit, a penultimate least significant bit, or bits that toggle frequently) to select the bank to be read or written. The method also includes queuing refresh requests in a refresh control circuit coupled to each bank. At least another embodiment includes a refresh control circuit that generates refresh requests independent from an elapsed time determination, each refresh request generated as a function of number of clock cycles received.

At least one embodiment of the method includes simultaneously performing access operations and refresh operations on different banks during the same clock cycle. Each refresh control circuit includes a counter configured to increment to reflect a refresh request, the incrementing occurring such that the counter coupled to only one of these banks increments on any given clock cycle. Further, an embodiment limits the number of banks simultaneously performing access operations and refresh operations to not more than three banks to prevent corruption of data by power supply noise.

The present invention may be better understood, and its numerous objects, features, and advantages made even more apparent to those skilled in the art by referencing the detailed description and accompanying drawings of the embodiments described below.

DETAILED DESCRIPTION OF THE INVENTION

Overview

An embodiment of the present invention is directed to a memory device including internal refresh control circuitry for automatically performing refresh of the memory array without user intervention and almost always without access interruption. A separate refresh control circuit is provided for each memory bank, each control being configured to execute a refresh operation, for its respective memory bank, during the first available cycle following a refresh request which request occurs once every, for example, 256 external clock cycles.

Unlike most earlier devices, an embodiment is directed to "hidden" refresh cycles that can fully complete in just one clock cycle, allowing a read or write access cycle to begin in the same memory bank on the very next clock cycle, if required, in accordance with a next command and address received. Thus, even if the memory bank is free for only one cycle, a hidden refresh operation can be fully performed and the memory bank ready on the very next cycle to accept an external read or write cycle with full confidence. This makes hidden refresh cycles possible totally under internal control, with no user interaction, because there is no risk that an external cycle will be received that cannot be immediately carried out because the memory bank is still busy performing an internal refresh cycle. For the same reason, there is no need for a "busy" signal to alert the user when an internal refresh cycle is in progress.

Figure 1:
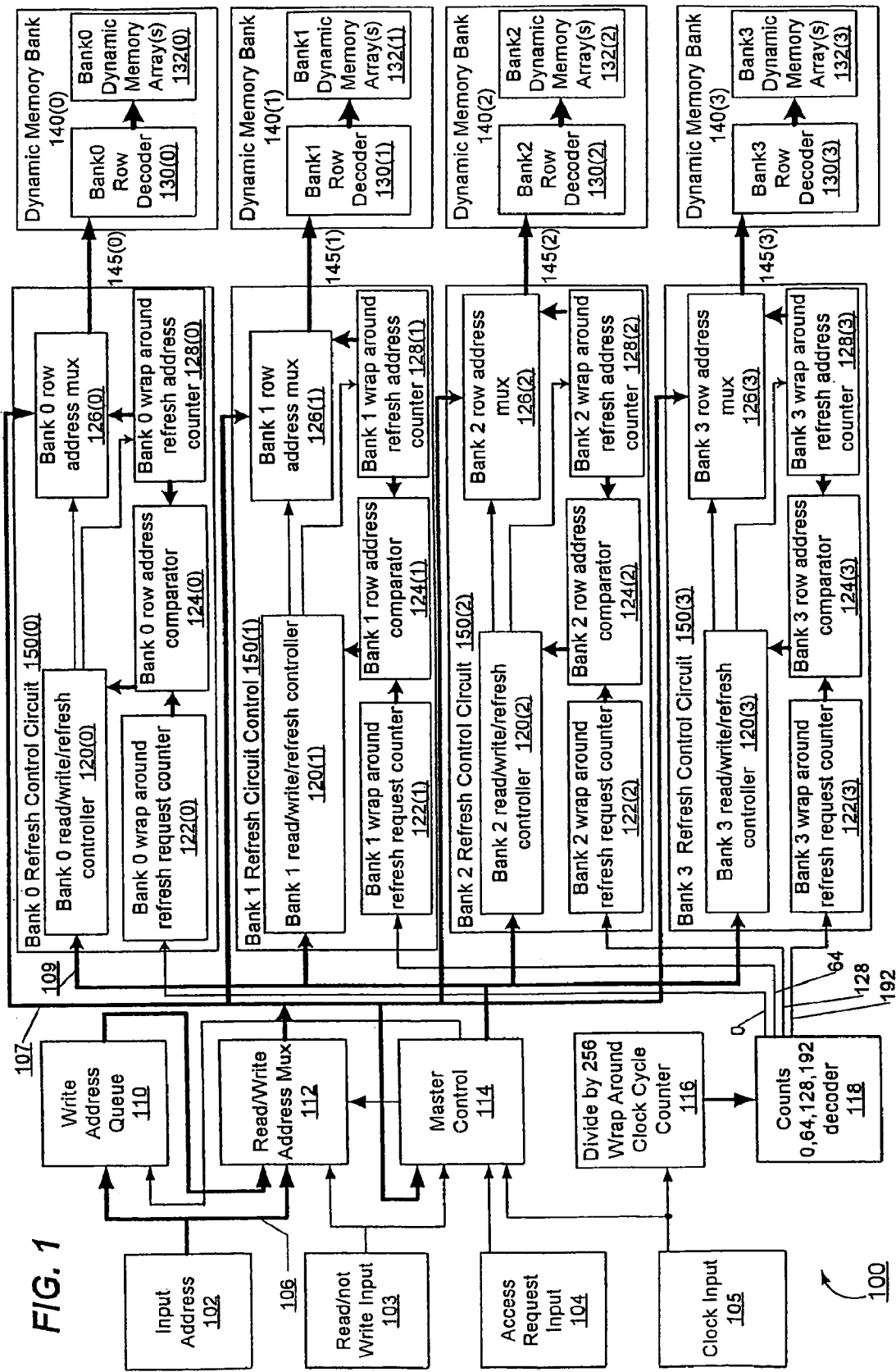
FIG. 1 is a block diagram of a memory device incorporating a dynamic memory array that provides an exemplary embodiment for describing the features and advantages of the present invention.

Referring to FIG. 1, there are shown respective counters such as wrap around refresh request counters 122(0:3) within each refresh control circuit 150(0:3), the inputs to the respective wrap around refresh request counters being offset so that every 64 external (clock) cycles one of the four memory banks (0:3) adds "1" to its number of queued or pending refresh requests. Whenever the number in the queue exceeds zero, that memory bank attempts a refresh on every cycle. Therefore, on the first available cycle after the queue is incremented, the request is retired (i.e., the refresh cycle is performed) and the count in the queue is decremented. No further refresh requests are pending in the queue when it decrements to its normal state of zero. The number of queued refresh requests for a bank is actually the number of counts that the wrap around refresh request counter 120(0:3) is ahead of a wrap around refresh address counter 128(0:3). For every 256 external clock cycles, as long as a memory bank is free for just one cycle, a hidden refresh can be performed without having the queued number of refresh requests increase, except momentarily. In the memory device embodiment described, two particular address bits (e.g., the A2 and A1 bit) choose which memory bank is addressed (in one particular implementation, the least significant bit (LSB), address bit A0, chooses between the upper or lower 36-bit word of a 72-bit data field accessed from a single memory bank).

In an exemplary embodiment, a user arranges the significance of the external address bits to use the same significance as the memory device; then, for any reasonable addressing sequence which accesses small or large blocks of memory, or even those which randomly address various addresses, the lower significance address bits are almost assuredly changing or toggling frequently. Consequently, as the memory device responds to the particular sequence of addresses, all four memory banks (0:3) are likely addressed with some reasonable frequency (thus ensuring that all (other) memory banks are free reasonably often, such as, on average, 192 out of 256 cycles if all cycles are read or write cycles, and even more if some cycles are idle or burst cycles). The likelihood of a single memory bank being busy for 256 straight cycles is very low. Moreover, the likelihood of a single memory bank being busy for additional multiples of 256 straight cycles is extremely low.

A refresh request does not need to be retired before the next refresh request arrives. Up to 63 refresh requests may be placed into the refresh queue. A refresh flag is provided in the extremely unlikely event that the internal refresh for a particular memory bank gets very far behind its desired rate (i.e., if too many refresh requests are queued). If the refresh queue is nearly full, the refresh flag is asserted. For example, if a particular memory bank that previously had no queued refresh requests has not performed a refresh cycle in 62×256 external clock cycles (because all those cycles required a read or write access to that bank), the refresh flag is asserted. However, even if a memory bank gets seriously "behind" and has queued up many refresh requests, if the memory bank thereafter is free for more than one cycle out of every 256 external clock cycles, refresh requests will be retired from the queue faster than new ones will be added, and the device will eventually "catch up." It is for this reason, along with the depth of the refresh queue, that the refresh flag is seldom, if ever, expected to be asserted (provided the user, for example, assigns the significance of the address bits as described).

In one embodiment, the refresh counters and control circuits are arranged to ensure that no more than three memory banks can perform an internal array operation at the same time (one performing a read or write cycle, and two each performing a hidden refresh cycle) to reduce the worst case current transients (i.e., power supply noise) that would occur if all four memory banks shown in FIG. 1 (or more than four memory banks in other embodiments) were simultaneously active.

The choice of counting clock cycles to determine when to refresh, rather than elapsed time, has several advantages.

First, it is easy to do. The clock exists and is always running (as required by the phase-locked delay line described in patent application Ser. No. 09/503,048, referenced above and incorporated herein for all purposes). Second, the refresh interval required for proper operation is more or less proportional to the operating cycle time. As the operating frequency increases (i.e., cycle time decreases), more minority carriers are injected into the substrate, increasing the leakage of the memory cells, thus decreasing the data retention time of the memory cells. Consequently, faster cycling (i.e., shorter cycle times) requires more frequent refreshing. Furthermore, another significant source of cell leakage is the sub-threshold conduction of the access transistors on unselected rows of memory cells. This sub-threshold conduction is significant only when the bit line (or complement bit line), to which the unselected memory cell is attached, is biased at VSS, which only occurs for a fixed time of about 2 ns per cycle. This component of memory cell leakage is directly proportional to frequency. Again, higher frequency operation requires more frequent refreshing.

Structure

Turning now to FIG. 1 more particular embodiments of the above-described refresh system are described. FIG. 1 shows a block diagram of a random access memory integrated circuit illustrating circuitry appropriate for the refresh operations described. Random access memory integrated circuit 100 includes input address block 102, read/not write input block 103, access request input block 104, clock input block 105, write address queue 110, read/write address multiplexer 112, input address bus 106, master control block 114, divide-by 256 wrap around clock cycle counter 116, clock cycle count decoder 118, refresh control circuits 150(0:3), and dynamic memory banks 140(0:3). In one or more embodiments, the input address block 102, read/not write input block 103, access request input block 104, and clock input block 105 receive signals from bonding pads.

Master control block 114 receives a clock signal from clock input block 105 and a variety of other control signals including a read/not write control from read/not write input block 103, an access request input from access request input block 104, and an input address via address bus 107. The master control block 114 prioritizes the read or write access requests over pending memory refresh requests. Read access requests are initiated without first determining whether data is available from outside the dynamic memory array, e.g., from an internal cache memory, thus avoiding a delay associated with such determination. Address bus 106 couples the input address block 102 to write address queue 110 (whose function is described in U.S. patent application Ser. No. 09/503, 048, incorporated herein for all purposes) and read/write address multiplexer 112. Address bus 107 couples the read or write address output from address multiplexer 112 to refresh control circuits 150(0:3). Control bus 109 couples the master control 114 to the bank read/write/refresh controllers 120(0:3).

Random access memory integrated circuit 100 further illustrates a plurality of dynamic memory banks 140(0:3). Each of the dynamic memory banks 140(0:3) includes a bank row decoder 130(0:3), and a corresponding bank dynamic memory array 132(0:3), respectively. Bank row address busses 145(0:3) couple each of the dynamic memory banks (140 (0:3) to a dedicated row address from a dedicated address multiplexer 126(0:3). Refresh control circuits 150(0:3) periodically refresh dynamic memory arrays 140(0:3) respectively, to maintain data.

The dynamic memory array, including each bank dynamic memory array 132(0:3) within each dynamic memory bank 140(0:3), receive read and write access requests. According to an embodiment, the read or write access requests have priority over pending refresh request. Further, one pending refresh request for a bank retires on a clock cycle not requiring an access of that dynamic memory bank. Refresh cycles, like access cycles, complete in a single clock cycle. The read access requests initiate an access to the dynamic memory array without first determining whether data is available from outside the dynamic memory array, thus avoiding a delay associated with such a determination. Because each memory bank 140(0:3) has a dedicated refresh control circuit 150(0: 3), one dynamic memory bank may execute a memory bank access while other banks may simultaneously execute refresh operations.

Figure 2:
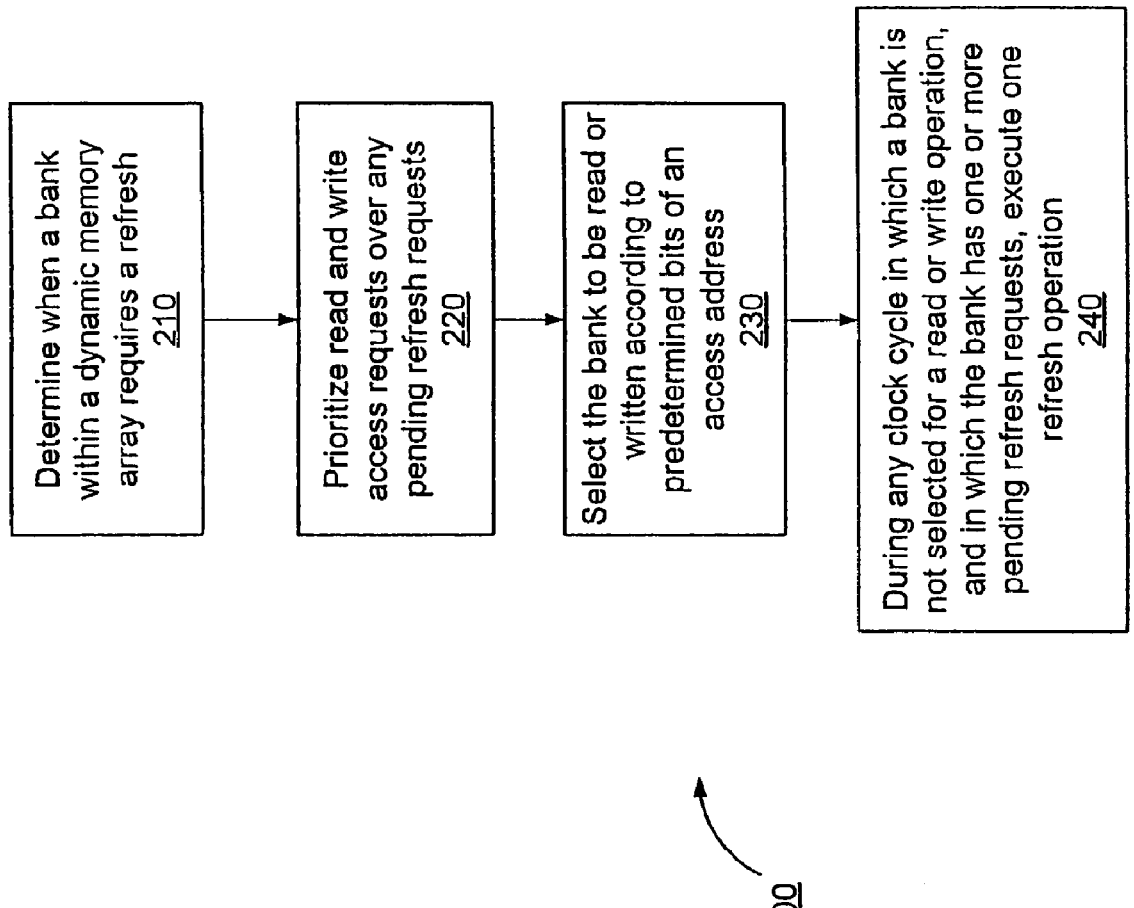
FIG. 2 is a flow diagram describing a refresh method according to an embodiment of the present invention.

Referring to FIG. 2, flow diagram 200 illustrates a method for refreshing a dynamic memory array when one (or more) of the banks in the dynamic memory array requires a refresh. During operation of a dynamic random access memory integrated circuit, such as that shown in FIG. 1, block 210 determines when a bank, such as dynamic memory banks 140(0:3) within a dynamic memory array requires a refresh. Block 220 prioritizes read and write access requests over any pending refresh request. In particular, the read and write access requests initiating an access to the dynamic memory array occur without a delay associated with determining whether data is available from a location outside the dynamic memory array or whether refresh requests are pending. Block 230 shows that the random access memory integrated circuit selects the bank (if any) to be read or written according to predetermined bits of the access address. Block 240 shows that during any clock cycle in which a memory bank is not selected for a read or write operation, and in which that bank has one or more pending refresh requests, one refresh operation is executed.

Returning to FIG. 1, each dynamic memory bank of memory banks 140(0:3) has an independent row address bus 145(0:3). A memory bank requiring read or write access has the access address while other memory banks requiring refresh have their respective refresh addresses. The bank row address multiplexers 126(0:3) use at least one bit of the read or write access address (and the access request) to select the bank for read or write access. The row address multiplexers 126(0:3) receive the bit(s) of the address selecting dynamic memory banks 140(0:3) for read or write access via address bus 107. Preferably, one or more of the lower order address bits select the memory bank for read or write access in random access memory integrated circuit 100. The address bit(s) that are used to select the memory bank 140(0:3) for read or write access, in one embodiment, are designed to change frequently, so that excessive accessing does not prevent a memory bank from the meeting refresh requirements. Choosing a low-order address bit to select banks helps cause the memory banks 140(0:3) to share read and write accessing to prevent one bank from receiving excessive accesses. Further, in random access memory integrated circuit 100, excessive accessing of a single bank may include read or write accesses exceeding, on average, over 255 clock cycles of every 256 clock cycles averaged over many thousands of clock cycles. That is, on average, each bank is expected to be free to retire a refresh request on at least 75% (at most only one of the four banks is accessed in any cycle and at least three of four banks are free to be refreshed) of clock cycles but can keep up with its refresh requirements even if it is free only 0.4% (1 of 256) of clock cycles. As one of ordinary skill in the art appreciates, the percentages will change according to design requirements, such as the number of banks in the circuit. A refresh is required once every predetermined number of clock cycles. In one embodiment, the predetermined number of clock cycles is 256 cycles. The number of clock cycles is a function of the refresh requirements for the dynamic memory array. Wrap around clock cycle counter 116 generates a count that increments once for every clock cycle returning to count 0 after a predetermined number of clock cycles, for example, each 256 clock cycles. The number of clock cycles may be according to the number of rows in the dynamic memory array, and according to the refresh requirements of the dynamic memory array.

Decoder 118 receives the count generated by wrap around clock cycle counter 116. Decoder 118 decodes counts 0, 64, 128 and 192. Each of these four decoder outputs toggles once every 256 clock cycles, but to reduce peak power consumption and noise, they do not toggle on the same cycle. More particularly, in a preferred embodiment, the number of clock cycles separating the decoder counts from decoder 118 is more than the maximum number of queued refresh requests queued for any bank. By having the maximum number of queued refresh requests for any bank be less than the number of clock cycles between cycles incrementing the plurality of wrap around refresh request counters 122(0:3) of the various banks 140(0:3), no matter how many banks are coupled to receive the toggled outputs from decoder 118, no more than two banks will ever perform a refresh on a given cycle. That is, no sequence of external read or write cycles (that do not cause the refresh flag to remain asserted for more than a few cycles) can cause more than two banks to refresh on the same clock cycle.

In an embodiment, each of the refresh control circuits 150(0:3) is coupled to receive its respective output from decoder 118. The refresh control circuits 150(0:3) inputs (decoder outputs) toggle a predetermined number of clock cycle counter counts apart, the predetermined number being greater than the maximum number of refresh requests permitted to be queued in any one refresh control circuit 150(0:3). In one embodiment, up to 62 refresh requests may be queued in any one refresh control circuit 150(0:3). Refresh control circuits 150(0:3) generate refresh requests. Each refresh control circuit 150(0:3) includes a read/write/refresh controller 120, a wrap around refresh request counter 122, a row address comparator 124, a row address multiplexer 126, and a wrap around refresh address counter 128. Wrap around refresh request counters 122(0:3) generate one refresh request (increment one count) upon receiving an input from decoder 118, the input being received at a particular count of wrap around clock cycle counter 116. The wrap around refresh request counters 122(0:3) in the bank refresh control circuits 150(0:3) increment at different times (in different cycles) to stagger the refresh operations of the banks 140(0:3). The staggering of refresh operations generates less noise than if all of the memory banks refreshed simultaneously. The wrap around refresh request counters 122(0:3) increment in response to the respective refresh signals generated by decoder 118. If it should ever occur (extremely unlikely) that a predetermined number of unsatisfied refresh request are queued in any bank, that bank refresh control circuit 150(n) will generate a flag signal (not shown in FIG. 1) to indicate that internal refresh requirements are not being met. This flag is an output of random access memory integrated circuit 100. In one embodiment, the predetermined number of queued refresh requests is greater than two, allowing more than one refresh request to be queued before the flag is generated.

Decoder 118 periodically toggles one of its outputs (0, 64, 128, 192) to periodically generate refresh requests for its respective dynamic memory bank 140. Wrap around refresh request counters 122(0:3) each increment once for each refresh request to its respective dynamic memory bank 140 (0:3). For example, referring to dynamic memory bank (1) assume that a clock cycle causes wrap around cycle counter 116 to advance to count 64. Wrap around refresh request counter 122(1) increments to a new count for dynamic memory bank 140(1).

The new count in bank 1 wrap around refresh request counter 122(1) for now differs from the address (count) in bank 1 wrap around refresh address counter 128(1). Bank 1 row address comparator 124(1) detects lack of equality and outputs a "refresh pending" signal to bank 1 read/write/refresh controller 120(1). This "refresh pending" cycle will last until the first cycle for which bank 1 is not busy doing, for example, a (higher priority) read or write access. More particularly, the refresh is immediately performed if bank 1 is not otherwise occupied with a read or write cycle (i.e., a normal read or write cycle or a burst read or write cycle to an internally generated address to continue a burst read or write). If the memory bank 140(1) happens to be busy with such a read or write cycle and is therefore unable to perform the refresh when requested, the request is queued and performed the first cycle that the memory bank is available (i.e., not executing a read or write cycle).

During the first such available cycle, the pending refresh will be retired. Specifically, bank 1 wrap around refresh address counter 128(1) provides the row address to be refreshed to bank 1 row address multiplexer 126(1), bank 1 row address multiplexer 126(1) then selects that address to place on bank 1 address bus 145(1), and bank 1 read/write/refresh controller 120(1) executes the refresh operation. After executing the refresh operation, bank 1 read/write/refresh controller 120(1) increments bank 1 wrap around refresh address counter 128(1) to the next count (row address) to be refreshed in that bank (here, bank 1).

With bank 1 wrap around refresh address counter 128(1) incrementing, the count of bank 1 wrap around refresh address counter 128(1) and the counts of bank 1 wrap around refresh request counter 122(1) now match. Thus, bank 1 row address comparator 124(1) outputs no present pending refresh requests.

In the very unlikely event that there are no available cycles to do the refresh (as when all cycles require bank 1 accesses), wrap around refresh request counter 122(1) may get many counts ahead of bank 1 wrap around refresh address counter 128(1). Then, the refresh requests may be retired in sequential cycles or otherwise as the lack of read/write activity to Bank 1 permits. If Bank 1 (or any bank) is so busy servicing access requests that fewer than one cycle per 256 (for example) clock cycles is available to retire refresh requests, and this condition continues until the count of wrap around refresh request counter 122(1) is ahead of the count of wrap around refresh address counter 128(1) by a large predetermined number of counts, then, a "refresh needed" flag (not shown) is raised by the row address comparator for that bank and by the random access integrated circuit 100 indicating that the circuit is not able to service its internal refresh requirements and that some cycles must soon be made available by the system that do not require read or write access (to Bank 1 in this case).

In general, a wrap around refresh address counter 128(n) (the n represents any one of the functional blocks shown in the four memory bank circuits 0:3, as each memory bank may perform refresh functions at different times) increments in response to a refresh of dynamic memory bank 140(n). Row address comparator 124(n) compares the count in the wrap around refresh request counter 122(n) with the count in the wrap around refresh address counter 128(n). When these counts are unequal, row address comparator 124(n) generates a signal indicating a pending refresh requirement for dynamic memory bank 140(n). The signal generated by row address comparator 124(n) is received by read/write/refresh controller 120(n). In addition, row address comparator 124(n) may assert a refresh flag when the count of wrap around refresh request counter 122(n) exceeds the count of wrap around refresh address counter 128(n) by a predetermined number. Wrap around refresh address counter 128(n) provides row address multiplexer 126(n) with a row address for refresh. The output of row address multiplexer 126(n) is coupled to an independent row address bus 145(n) dedicated to dynamic memory bank 140(n). Independent row address busses 145(n) allow at least one bank to perform a refresh operation of a refresh address and another bank to perform an access operation of an access address in the same clock cycle.

The many aspects, features, and advantages of the present invention are conveyed herein by describing several exemplary embodiments of a high-performance dynamic random access memory (DRAM) memory device. Simplified block diagrams are shown to more easily communicate key concepts, features, or implementation details. One skilled in the art will recognize the many teachings of this disclosure and be able to apply these teachings to additional embodiments and, indeed, to other kinds of devices, as well, without departing from the teachings of this disclosure. Consequently, the scope of the invention should not be inferred as being limited by the exemplary embodiments described herein, but rather should be viewed as teaching in the art far greater than just these exemplary embodiments. Accordingly, other embodiments, variations, and improvements not described herein are not necessarily excluded form the scope of the invention.

What is claimed is:

1. A method, comprising:
   performing, by a first refresh control circuit, an access operation on a first bank of a plurality of memory banks in a memory array; and
   retiring, by a second refresh control circuit and substantially simultaneously with said performing an access operation on a first bank, a pending refresh request for a second memory bank of the plurality of memory banks, wherein the pending refresh request is pending as a result of a differential comparison between a refresh request counter and a refresh address counter of the second refresh control circuit.

2. The method of claim 1, wherein said retiring occurs during a clock cycle, and wherein said performing also occurs during the clock cycle.

3. The method of claim 1, further comprising retiring, by a third refresh control circuit and substantially simultaneously with said performing an access operation on a first bank, another pending refresh request for a third memory bank of the plurality of memory banks, wherein the other pending refresh request is pending as a result of a differential comparison between a refresh request counter and a refresh address counter of the third refresh control circuit.

4. The method of claim 1, further comprising performing, by a third refresh control circuit and substantially simultaneously with said retiring a pending refresh request, another access operation on a third memory bank of the plurality of memory banks.

5. The method of claim 1, further comprising queuing, by the first refresh control circuit, another pending refresh request for the first bank of the plurality of memory banks, wherein the other pending refresh request is pending as a result of a differential comparison between a refresh request counter and a refresh address counter of the first refresh control circuit.

6. A system, comprising:
   a memory array having a plurality of memory banks; and
   a plurality of refresh control circuits respectively coupled to the plurality of memory banks of the memory array and configured to:
      perform, by a first one of the plurality of refresh control circuits, an access operation on a first bank of the plurality of memory banks; and
      retire, by a second one of the plurality of refresh control circuits and substantially simultaneously with a performance of the access operation, a pending refresh request for a second memory bank of the plurality of memory banks;
   wherein the second refresh control circuit includes a refresh request counter and a refresh address counter configured to store respective counter values to enable the second refresh control circuit to use the counter values to determine whether a refresh request is pending for the second memory bank.

7. The system of claim 6, wherein the second refresh control circuit is further configured to retire the pending refresh request during a clock cycle, and wherein the first refresh control circuit is further configured to perform the access operation during the clock cycle.

8. The system of claim 6, wherein a third one of the plurality of refresh control circuits is configured to retire, substantially simultaneously with the access operation, another pending refresh request for a third memory bank of the plurality of memory banks, and wherein the third refresh control circuit includes another refresh request counter and another refresh address counter configured to store respective other counter values to enable the third refresh control circuit to use the other counter values to determine whether another refresh request is pending for the third memory bank.

9. The system of claim 6, wherein a third one of the plurality of refresh control circuits is configured to perform, substantially simultaneously with the retirement of the pending refresh request, another access operation on a third memory bank of the plurality of memory banks.

10. The system of claim 6, wherein the first refresh control circuit is further configured to determine whether a refresh request is pending for the plurality of memory banks, and wherein the first refresh control circuit includes another refresh request counter and another refresh address counter configured to store respective other counter values to enable the first refresh control circuit to use the other counter values to determine whether another refresh request is pending for the first memory bank.

* * * * *

UNITED STATES PATENT AND TRADEMARK OFFICE
CERTIFICATE OF CORRECTION

PATENT NO.        : 8,151,044 B2
APPLICATION NO.   : 12/635543
DATED             : April 3, 2012
INVENTOR(S)       : Proesbsting Page 1 of 1

It is certified that error appears in the above-identified patent and that said Letters Patent is hereby corrected as shown below:

On the Face Page, item (75), under "Inventor", in Column 1, Line 1,
delete "Robert Proesbsting," and insert -- Robert J. Proesbsting, --, therefor.

On Page 2, item (56), under "OTHER PUBLICATIONS", in Column 2, Line 49,
delete "Bitlikne" and insert -- Bitline --, therefor.

On Page 2, item (56), under "OTHER PUBLICATIONS", in Column 2, Line 54,
delete "Line,9"" and insert -- Line," --, therefor.

On Page 2, item (56), under "OTHER PUBLICATIONS", in Column 2, Line 70,
delete "Mulitgigabit" and insert -- Multigigabit --, therefor.

On Page 3, item (56), under "OTHER PUBLICATIONS", in Column 1, Line 32,
delete "Mircorprocessor,"" and insert -- Microprocessor," --, therefor.

On Page 3, item (56), under "OTHER PUBLICATIONS", in Column 1, Line 35,
delete "SRAM;s,"" and insert -- SRAMs," --, therefor.

On Page 3, item (56), under "OTHER PUBLICATIONS", in Column 2, Line 4,
delete "non-Prechaged" and insert -- non-Precharged --, therefor.

On Page 3, item (56), under "OTHER PUBLICATIONS", in Column 2, Line 52,
delete "Marco" and insert -- Macro --, therefor.

On Page 3, item (56), under "OTHER PUBLICATIONS", in Column 2, Line 56,
delete "Techniquesfor" and insert -- Techniques for --, therefor.

In Column 11, Line 30, delete "form" and insert -- from --, therefor.

Signed and Sealed this
Twentieth Day of November, 2012

David J. Kappos
*Director of the United States Patent and Trademark Office*